(12) United States Patent
Gillotti et al.

(10) Patent No.: US 7,614,538 B2
(45) Date of Patent: Nov. 10, 2009

(54) DEVICE CLAMP FOR REDUCING OXIDATION IN WIRE BONDING

(75) Inventors: Gary S. Gillotti, Bensalem, PA (US); E. Walter Frasch, Perkasie, PA (US); Krishnan Rama, Singapore (SG); Xin Ji Zhang, Singapore (SG)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 167 days.

(21) Appl. No.: 11/742,696

(22) Filed: May 1, 2007

(65) Prior Publication Data

US 2007/0284421 A1 Dec. 13, 2007

Related U.S. Application Data

(60) Provisional application No. 60/747,214, filed on May 15, 2006.

(51) Int. Cl.
*B23K 37/00* (2006.01)
*B23K 37/04* (2006.01)

(52) U.S. Cl. .......................... 228/4.5; 228/42; 228/44.7

(58) Field of Classification Search .................. 228/212, 228/219, 4.5
See application file for complete search history.

(56) References Cited

U.S. PATENT DOCUMENTS

| | | | |
|---|---|---|---|
| 5,205,463 A | 4/1993 | Holdgrafer et al. | |
| 5,265,788 A | 11/1993 | Ozawa | |
| 6,062,459 A * | 5/2000 | Sabyeying | 228/4.5 |
| 6,062,462 A | 5/2000 | Gillotti et al. | |
| 6,156,990 A | 12/2000 | Ellis | |
| 6,234,376 B1 | 5/2001 | Wicen | |
| 6,866,182 B2 | 3/2005 | Wong et al. | |
| 7,182,793 B2 | 2/2007 | Duan et al. | |
| 2004/0065720 A1 * | 4/2004 | Wong et al. | 228/219 |
| 2004/0115959 A1 * | 6/2004 | Yeap et al. | 438/800 |
| 2004/0152292 A1 | 8/2004 | Babinetz et al. | |
| 2005/0161488 A1 * | 7/2005 | Duan et al. | 228/42 |

* cited by examiner

*Primary Examiner*—Kiley Stoner
(74) *Attorney, Agent, or Firm*—Christopher M. Spletzer, Sr.

(57) ABSTRACT

A device clamp configured for use with a wire bonding machine is provided. The device clamp includes a body portion defining at least one device aperture. Each of the at least one device apertures is configured to be positioned adjacent a bond site area of the wire bonding machine. The body portion includes a inlet port for receiving a fluid from a gas supply source. The body portion defines a fluid path from the inlet port to the at least one device aperture.

15 Claims, 10 Drawing Sheets

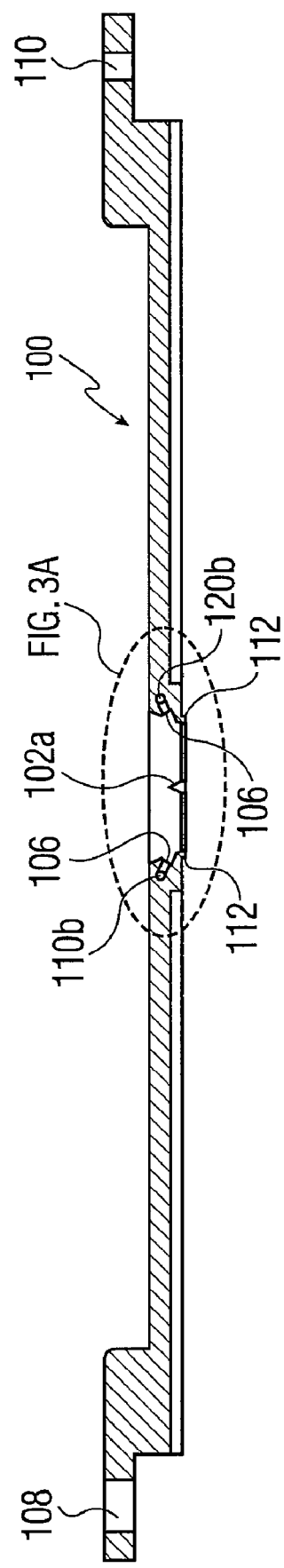

DEVICE CLAMP FOR REDUCING OXIDATION IN WIRE BONDING

CROSS-REFERENCE TO RELATED APPLICATIONS

This application claims the benefit of U.S. Provisional Application No. 60/747,214, filed May 15, 2006, the contents of which are incorporated herein by reference.

FIELD OF THE INVENTION

The present invention relates to wire bonding of semiconductor devices, and more particularly, to providing a cover gas to the bond site area of a wire bonding machine.

BACKGROUND OF THE INVENTION

In the manufacturer of various semiconductor devices, wire bonding techniques are often used to connect components in the devices (e.g., die to substrate/leadframe bonding; die to die bonding, etc.). For example, wire bonds (aka wire loops) are often used to provide electrical interconnection between (1) die pads of a semiconductor die and (2) contacts (e.g., leads) of a substrate (e.g., a leadframe) upon which the semiconductor die is mounted. An exemplary conventional wire bonding operation involves (1) bonding a first bond to a first bonding location on a die (e.g., using ball bonding), (2) extending a wire toward a second bonding location on a leadframe, (3) bonding the end of the extended wire to the second bonding location, and (4) cutting the wire. In such ball bonding, an electronic flame off (i.e., EFO) wand or the like is typically used to form a "ball" (aka a free air ball) at the end of the wire.

Often, gold wire (which is substantially non-reactive with oxygen) is used in wire bonding processes; however, in certain applications, more reactive metals (e.g., copper, silver, palladium, aluminum, etc.) are used. These more reactive metals may react, for example, in the presence of oxygen and form oxides/oxidation on the wires (and/or wire ends or tails) which are undesirable for wire bonding.

In view of such potential oxidation, certain wire bonding systems include subsystems for providing a cover gas to the end of a wire during formation of the ball by the EFO wand. For example, U.S. Pat. No. 6,234,376, which is incorporated by reference in its entirety, discloses such a system. Unfortunately, such cover gas subsystems do not protect the entire wire (or the entire duration of the wire bonding process) from potential oxidation, and as such, oxidation problems in wire looping with reactive metals still exists.

Other attempts at reducing oxidation in the processing of semiconductor devices include U.S. Pat. No. 5,265,788 (titled "Bonding Machine with Oxidation Preventive Means"); U.S. Pat. No. 6,866,182 (titled "Apparatus and Method to Prevent Oxidation of Electronic Devices"); and U.S. Pat. No. 7,182,793 (titled "System for Reducing Oxidation of Electronic Devices"). Certain of these conventional systems use a clamp in conjunction with other devices in order to reduce the potential for oxidation; however, such systems tend to be complex and may be costly as additional components are added to the wire bonding system.

Thus, it would be desirable to provide a method and apparatus for reducing oxidation in wire bonding.

SUMMARY OF THE INVENTION

According to an exemplary embodiment of the present invention, a device clamp configured for use with a wire bonding machine is provided. The device clamp includes a body portion defining at least one device aperture. Each of the at least one device apertures is configured to be positioned adjacent a bond site area of the wire bonding machine. The body portion includes an inlet port for receiving a fluid from a gas supply source (e.g., a cover gas supply source such as gas tubing or the like). The body portion defines a fluid path from the inlet port to the at least one device aperture.

According to another exemplary embodiment of the present invention, a wire bonding machine is provided. The wire bonding machine includes a work table for supporting devices to be processed by the wire bonding machine. The wire bonding machine also includes a device clamp configured to clamp the devices to be processed. The device clamp defines at least one device aperture. Each of the at least one device apertures is configured to be positioned adjacent a bond site area of the wire bonding machine. The device clamp includes an inlet port for receiving a fluid from a gas supply source (e.g., a cover gas). The device clamp defines a fluid path from the inlet port to the at least one device aperture.

According to yet another exemplary embodiment of the present invention, a method of providing a fluid (e.g., a cover gas) to a bond site area of a wire bonding machine is provided. The method includes the steps of (1) providing a device clamp configured to clamp a semiconductor device to be processed, the device clamp defining at least one device aperture, each of the at least one device apertures being configured to be positioned adjacent the bond site area of the wire bonding machine; (2) flowing a fluid, from a gas supply source, into an inlet port of the device clamp; and (3) flowing the fluid from the inlet port of the device clamp through a fluid path defined by the device clamp such that the fluid flows to the at least one device aperture.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2B is a side cross-sectional view of the device clamp of FIG. 1 taken along line 2B-2B of FIG. 2A;

DETAILED DESCRIPTION OF THE INVENTION

U.S. Pat. Nos. 5,205,463, 6,062,462, and 6,156,990, as well as United States Patent Publication No. 2004/0152292, as well as U.S. patent application Ser. No. 11/380,233, relate to wire bonding technology, and are herein incorporated by reference in their entirety.

According to certain exemplary embodiments of the present invention, a fluid (e.g., a cover gas such as a gas including nitrogen, argon, etc.) (where the gas may or may not include a reducing gas such as hydrogen) is provided in the vicinity of the bond site area of a wire bonding machine. For example, during a wire bonding operation, a constant supply of the fluid may be provided at the bond site area such that during the wire bonding operation there is a reduced potential for oxidation of the wires. Depending upon the fluid (and temperature) used, there may also be a reduction of oxide/oxidation already present on the wires, similar to the effect of applying a reducing gas during formation of a free air ball.

For example, during a wire bonding operation, after completing a wire loop (and prior to forming the next free air ball) a wire tail (e.g., the end portion of wire suspended from a capillary tip) may be subjected to oxygen or the like resulting in oxides forming on the wire tail. Such oxides may be undesirable for bonding, even if the wire tail is later formed into a free air ball. The present invention addresses such a situation by providing (in certain exemplary embodiments) a constant supply of cover gas in the bond site area such that the wire tail is protected from oxidation prior to formation of the next free air ball. The present invention also helps to protect against oxidation of the wire (and/or wire ends) during various other phases of the wire bonding cycle such as, for example, (1) when forming the second bond in the bond site area, (2) when lowering a formed free air ball to the bond site area, amongst others.

Figure 1:
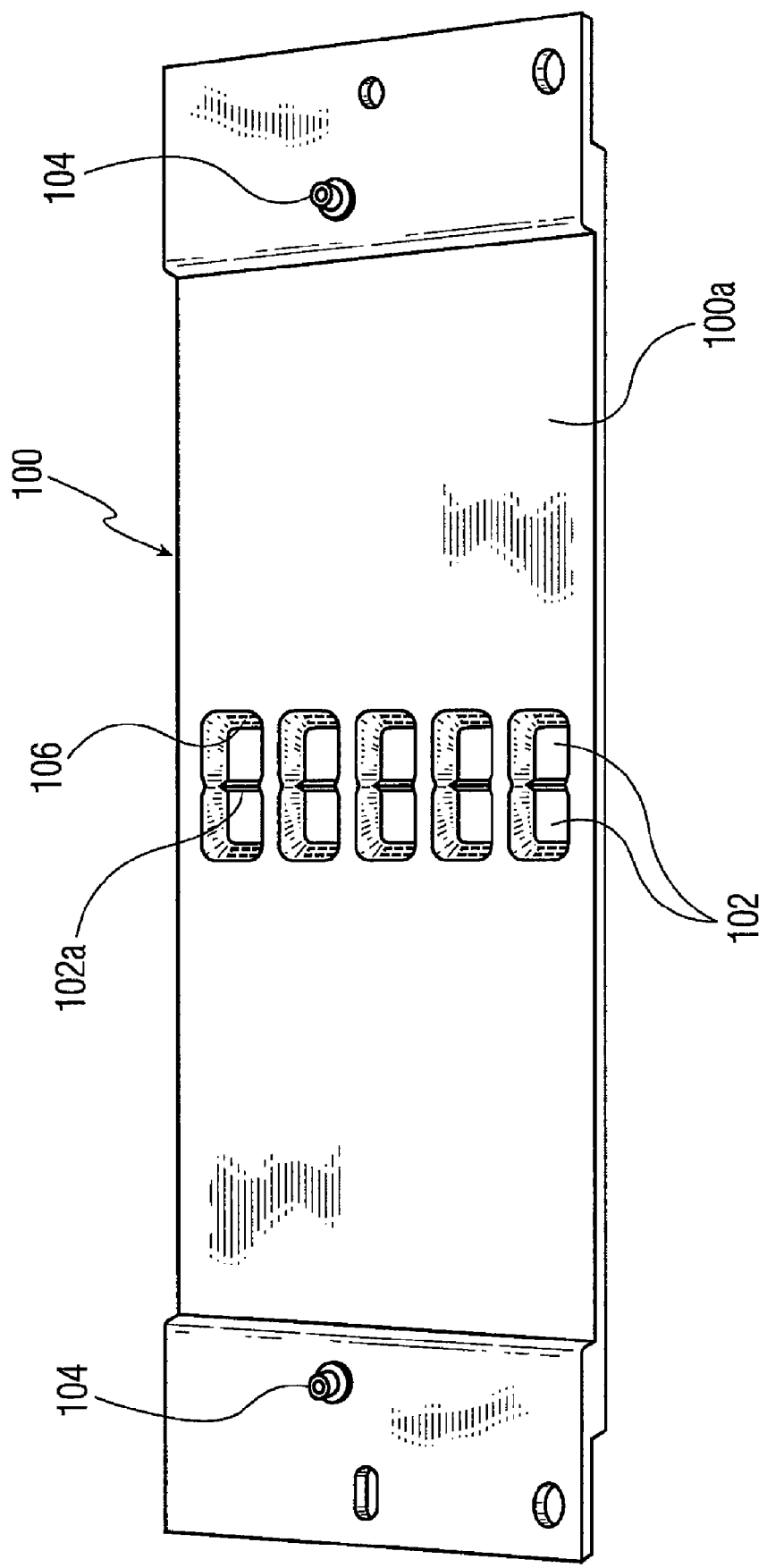
FIG. 1 is a top perspective view of a device clamp for use in a wire bonding system in accordance with an exemplary embodiment of the present invention.

FIG. 1 illustrates device clamp 100 configured for use with a wire bonding machine (not shown). As is understood by those skilled in the art, device clamp 100 may be positioned above a semiconductor device to be wirebonded (e.g., a semiconductor die mounted on a substrate), such that a wire bonding tool (e.g., a capillary) may be used to perform the wire bonding operation through device apertures 102 defined in device clamp 100. For example, a wire bonding machine includes a work table (e.g., a bonding surface) where semiconductor devices (e.g., semiconductor dice mounted on substrates/leadframes) are positioned during a wire bonding operation. Device clamp 100 is used to clamp (secure) the semiconductor devices in position with respect to the work table during the wire bonding operation. As is also known by those skilled in the art, a heat block or other heating element may be provided as part of the work table (the bonding surface below device clamp 100) to provide the desired heating for the wire bonding operation.

Exemplary device clamp 100 includes a body portion (wherein the body portion is the main structure of device clamp 100) which defines 10 (i.e., ten) device apertures 102 which are defined in 5 rows (each row defining two apertures 102 separated by cross member 102a). Of course, any number of apertures may be defined in the device clamp in any configuration within the scope of the present invention. Clamp 100 includes upper surface 100a which is on the top side of clamp 100 (the lower surface of clamp 100, which is not shown in FIG. 1, is typically positioned adjacent a heat block and/or the work table of the wire bonding machine). Clamp 100 also includes two fluid connectors 104 which are configured to be connected to a fluid supply source (e.g., a gas supply source such as a gas line or gas tubing). Gas that enters connectors 104 travels through pathways internal to clamp 100 to exit openings 106 at the bond site area corresponding to each aperture 102.

Figure 2A:
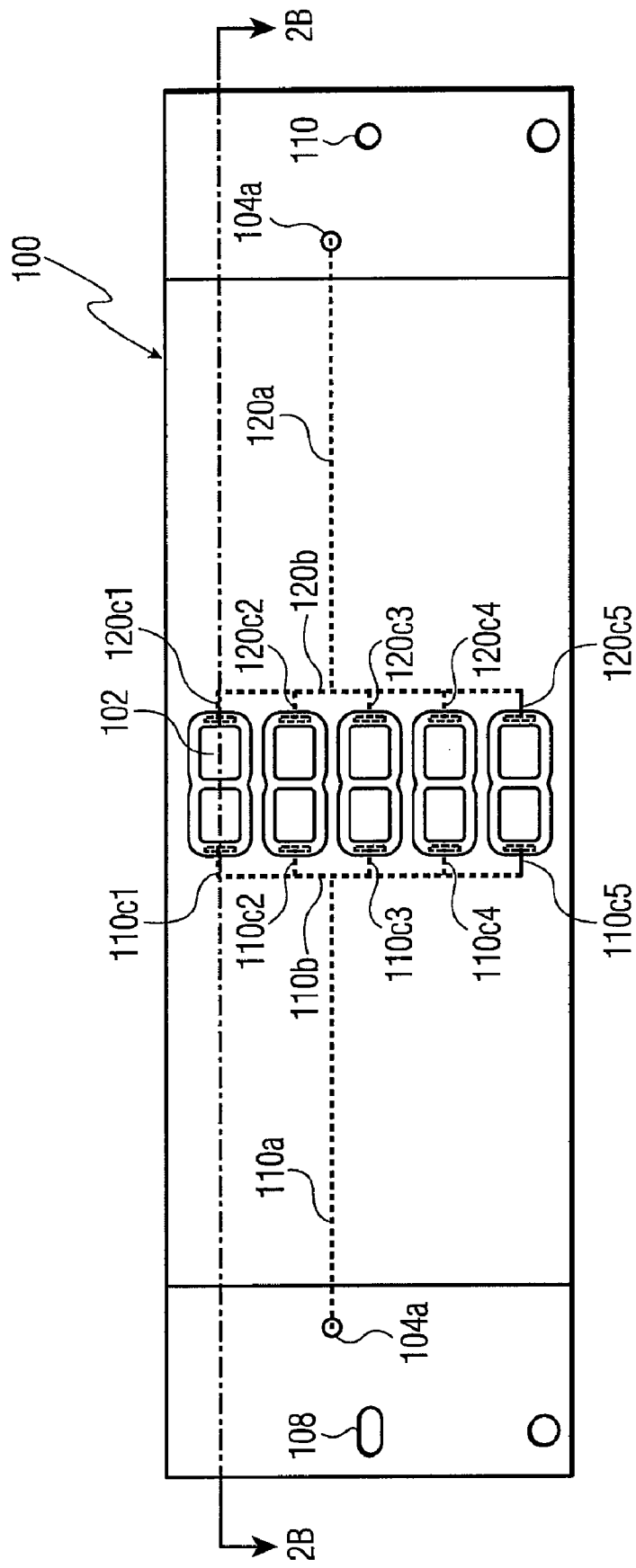
FIG. 2A is a top view of the device clamp of FIG. 1.

Referring now to FIG. 2A, a top view of clamp 100 is provided, with connectors 104 removed to illustrate inlet ports 104a (i.e., apertures/openings 104a). In this exemplary embodiment, inlet ports 104a are on the top surface of clamp 100 such that making connections to the inlet ports 104a (e.g., to connect gas supply lines/sources to the inlet port connectors) is easily facilitated. Further, by inlet ports 104a being away from the device apertures 102 (i.e., in the exemplary embodiment illustrated in FIG. 2A, the inlet ports 104a are provided on either side of clamp 100, on the outer "stepped" portions of the device clamp which include the mounting apertures 108/110), connections from a gas supply source to the inlet ports 104a tends to not interfere with the wire bonding operation and associated components.

Apertures 108/110 (e.g., mounting/alignment apertures 108/110) are also shown in FIG. 2A (as viewed from FIG. 2B apertures 108/110 are defined at each of the outer stepped regions of clamp 100, in contrast to the larger central portion of clamp 100 which is lower than the stepped portions). Inlet ports 104a are openings that are the entry points of gas into clamp 100. Gas that enters clamp 100 through inlet port 104a travels along a path to a respective bond site area (where the bond site area is adjacent the area defined by each of the device apertures for performing a wire bonding operation when a device clamp is in position on a wire bonding machine). In accordance with the present invention, there are numerous potential paths that may be provided between (1) the one or more inlet ports of a device clamp and (2) the one or more device apertures of the device clamp.

Referring again to the example in FIG. 2A, gas flow paths are provided from each of the inlet ports 104a to a corresponding portion of the device apertures 102 defined by device clamp 100. More specifically, gas flow paths are provided from each of the two inlet ports 104a to five of the device apertures 102 defined by device clamp 100. As viewed from FIG. 2A, gas that enters the left hand inlet port 104a travels along length 110a, and then to length 110b. From length 110b, five relatively short lengths (i.e., 110c1, 110c2, 110c3, 110c4, and 110c5) are defined for gas flow to each of the five left hand device apertures 102. Each of the lengths 110c1, 110c2, 110c3, 110c4, and 110c5 terminates at a respective exit opening 106 at a corresponding device aperture 102 (see, for example, FIGS. 2B and 3A). Likewise, gas that enters the right hand inlet port 104a travels along length 120a, and then to length 120b. From length 120b, five relatively short lengths (i.e., 120c1, 120c2, 120c3, 120c4, and 120c5) are defined for gas flow to each of the five right hand device apertures 102. Each of the lengths 120c1, 120c2, 120c3, 120c4, and 120c5 terminates at a respective exit opening 106 at a corresponding device aperture 102.

Thus, a path internal to the body portion of device clamp 100 is defined between each of inlet port 104a and a corresponding device aperture 102. By providing the entire path from the gas source entering at inlet port 104a to the respective bond site area entirely within device clamp 100, a clearly defined path for fluid is provided, where said fluid will not undesirably flow to other areas. Further still, fluid (and fluid pressure) can be saved because of the path being internal to the device clamp.

One exemplary path from the left hand inlet port 104a to the top left hand device aperture 102 (as viewed in FIG. 2A)

starts at inlet port 104a, extends along length 110a, turns upward to length 110b ("upward" as shown in FIG. 2A, but of course being a relative term), turns right along length 110c1 ("right" as shown in FIG. 2A, but of course being a relative term), and terminates at opening 106 at the top left hand device aperture 102.

FIG. 2B illustrates a side cross sectional view of device clamp 100. This view illustrates cross member 102a (also shown in FIG. 1) and exit openings 106. Exit openings 106 which lead to a corresponding bond site area are shown extending along what may be termed the x-axis of the wire bonder; however, this designation is a relative expression. FIG. 2B also illustrates other features of device clamp 100 including apertures 108/110 (e.g. mounting/alignment apertures) and device clamp lip 112. Detail "FIG. 3A" of FIG. 2B is shown in FIG. 3A.

Figure 3A:
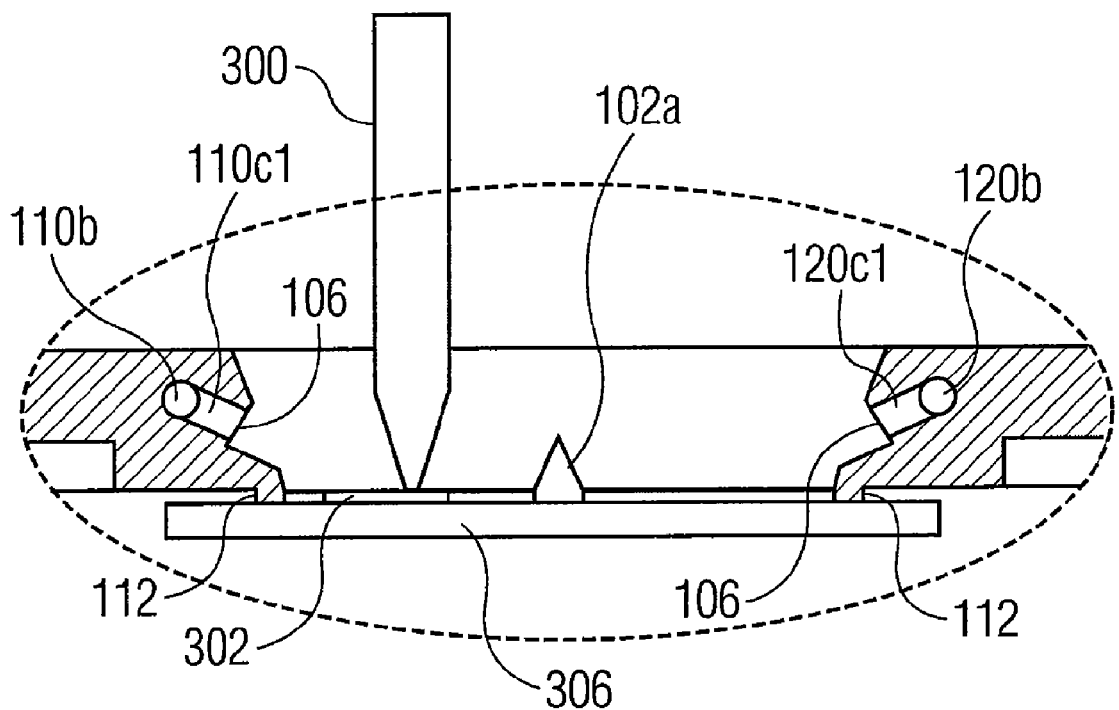
FIG. 3A is a detailed view of a portion of FIG. 2B along with other exemplary components of a wire bonding process.

FIG. 3A more clearly illustrates exit openings 106, as well as lengths 110b, 110c1, 120b, and 120c1. FIG. 3A also illustrates various exemplary components of a wire bonding process including capillary 300, substrate 306 (e.g., leadframe 306), and semiconductor die 302 mounted to substrate 306. Device clamp lip 112 is in contact with substrate 306 during the wire bonding operation. As is known to those skilled in the art, a wire that is engaged in capillary 300 is used to form wire loops that extend between two bonding locations (e.g., a die pad on semiconductor die 302 and a contact/lead of substrate 306). As is also known to those skilled in the art, device clamp 100 is used to clamp (secure) substrate 306 (to which semiconductor die 302 is mounted) to a bond plane (e.g., a work table) of a wire bonding machine. Further, a heating element (e.g., a heat block) may be included in the work table of the wire bonding machine.

Figure 3B:
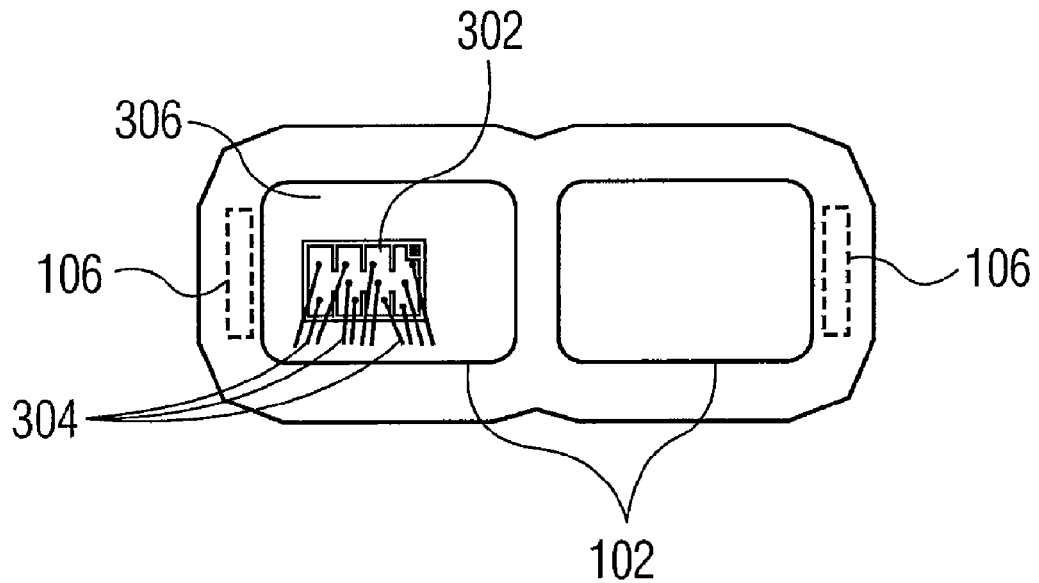
FIG. 3B is a top view of a portion of the device clamp of FIG. 2A and a semiconductor device.

FIG. 3B is a top view of a portion of device clamp 100 showing two apertures 102. Further, semiconductor die 302, a portion of substrate 306, and wire loops 304 (that provide electrical interconnection between semiconductor die 302 and substrate 306) are illustrated through the left hand device aperture 102.

Figure 4A:
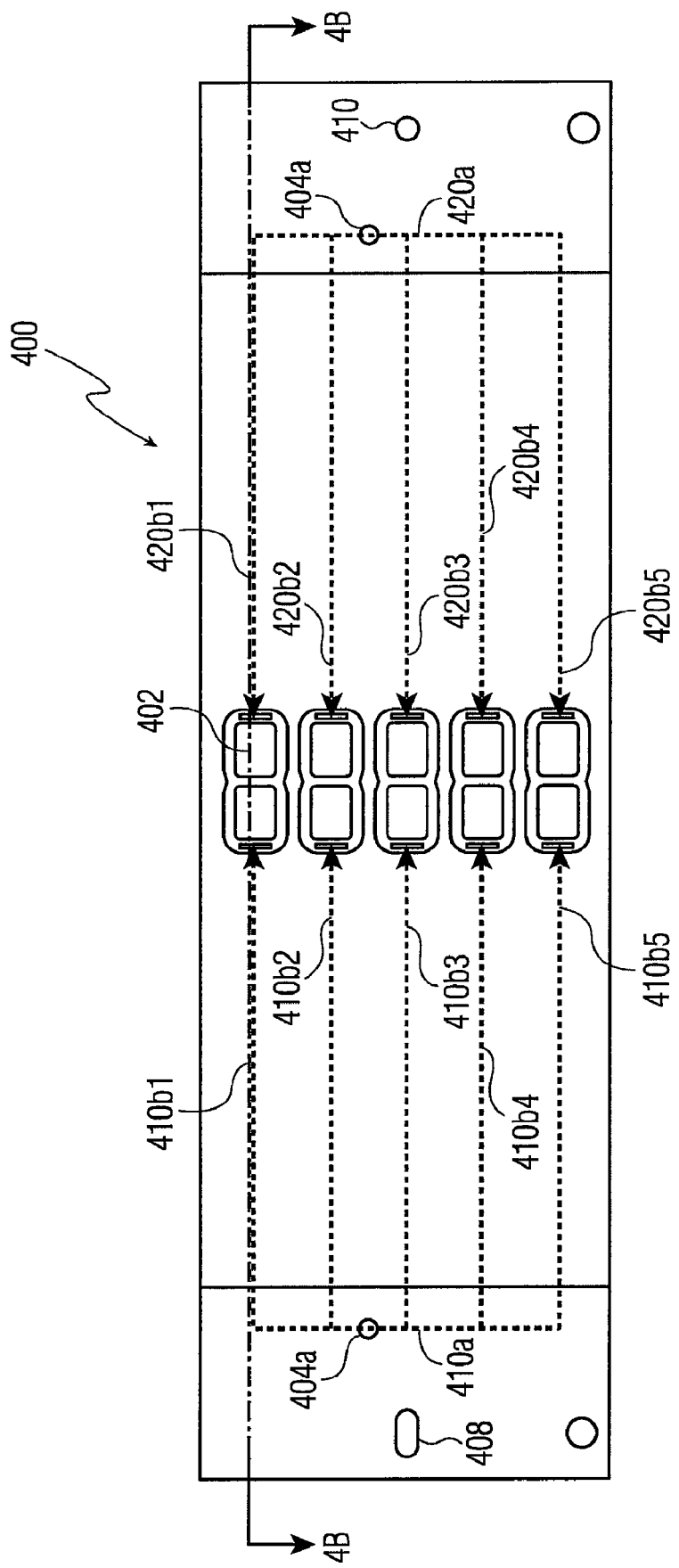
FIG. 4A is a top view of a device clamp for use in a wire bonding system in accordance with another exemplary embodiment of the present invention.

Referring now to FIG. 4A, a top view of another exemplary device clamp 400 is provided, with connectors (e.g., connectors similar to connectors 104 shown in FIG. 1) removed to illustrate inlet ports 404a (i.e., apertures/openings 404a). Inlet ports 404a are openings that are the entry points of gas into clamp 400. Gas that enters clamp 400 through inlet ports 404a travels along a path to a respective bond site area (where the bond site area is adjacent the area defined by each of the device apertures for performing a wire bonding operation when a device clamp is in position on a wire bonding machine).

Gas flow paths are provided from each of the inlet ports 404a to a corresponding portion of the device apertures 402 defined by device clamp 400. More specifically, gas flow paths are provided from each of the two inlet ports 404a to five of the device apertures 402 defined by device clamp 400. As viewed from FIG. 4A, gas that enters the left hand inlet port 404a travels along length 410a, and then to each of lengths 410b1, 410b2, 410b3, 410b4, and 410b5. Each of the lengths 410b1, 410b2, 410b3, 410b4, and 410b5 terminates at a respective exit opening 406 at a corresponding device aperture 402 (see, for example, FIG. 4B). Likewise, gas that enters the right hand inlet port 404a travels along length 420a, and then to each of lengths 420b1, 420b2, 420b3, 420b4, and 420b5. Each of the lengths 420b1, 420b2, 420b3, 420b4, and 420b5 terminates at a respective exit opening 406 at a corresponding device aperture 402.

Thus, a path internal to the body portion of device clamp 400 is defined between each of inlet port 404a and a corresponding device aperture 402. One exemplary path from the left hand inlet port 404a to the top left hand device aperture 402 (as viewed in FIG. 4A) starts at inlet port 404a, extends along length 410a, turns right along length 410b1 ("right" as shown in FIG. 4A, but of course being a relative term), and terminates at opening 406 at the top left hand device aperture 102.

Figure 4B:
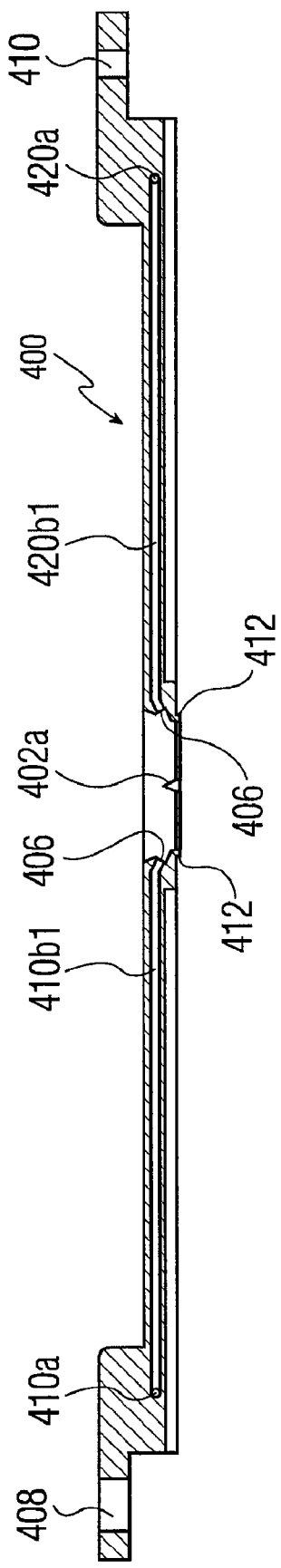
FIG. 4B is a side cross-sectional view of the device clamp of FIG. 4A taken along line 4B-4B of FIG. 4A.

FIG. 4B illustrates a side cross sectional view of device clamp 400. This view illustrates cross member 402a, exit openings 406, a portion of length 410a, length 410b1, a portion of length 420a, and length 420b1. Exit openings 406 which lead to a corresponding bond site area are shown extending along what may be termed the x-axis of the wire bonder; however, this designation is a relative expression. FIGS. 4A-4B also illustrate apertures 408/410 (e.g., mounting/alignment apertures 408/410), and FIG. 4B illustrates device clamp lip 412.

Figure 5A:
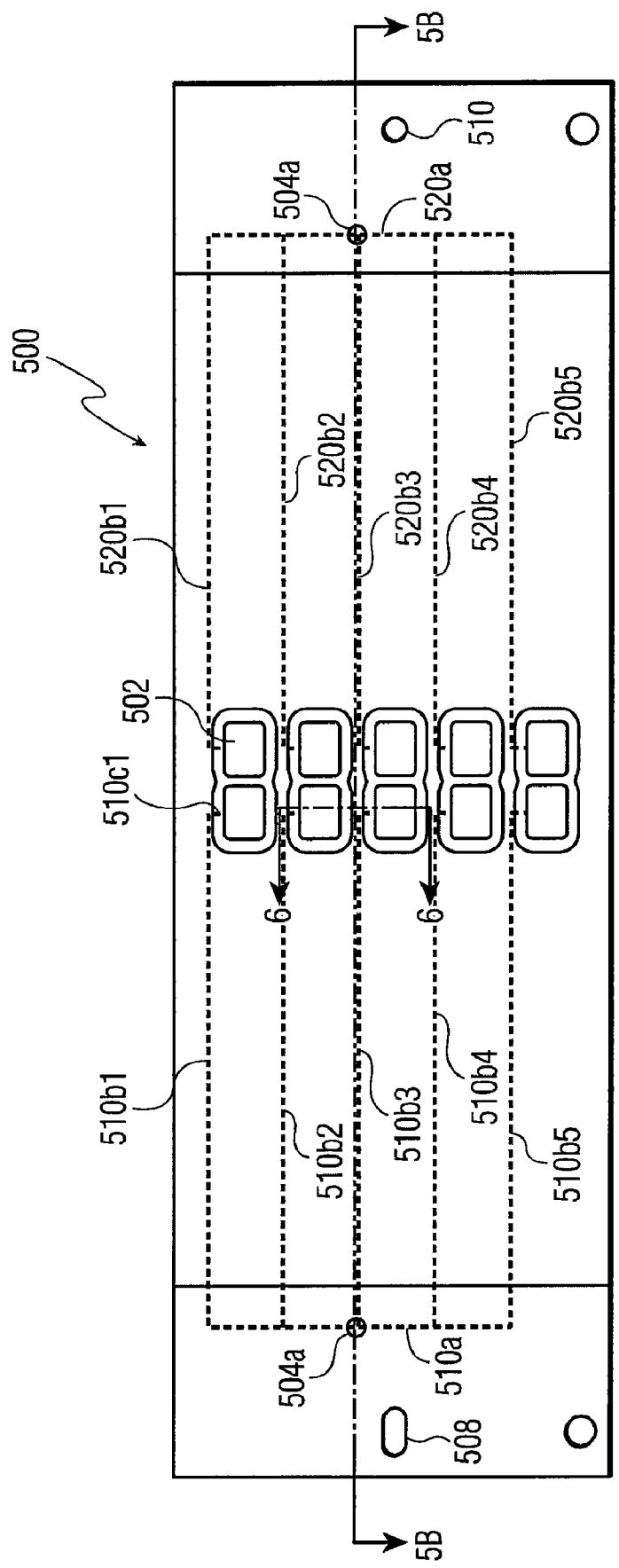
FIG. 5A is a top view of a device clamp for use in a wire bonding system in accordance with another exemplary embodiment of the present invention.

Referring now to FIG. 5A, a top view of another exemplary device clamp 500 is provided, with connectors (e.g., connectors similar to connectors 104 shown in FIG. 1) removed to illustrate inlet ports 504a (i.e., apertures/openings 504a). Inlet ports 504a are openings that are the entry points of gas into clamp 500. Gas that enters clamp 500 through inlet port 504a travels along a path to a respective bond site area (where the bond site area is adjacent the area defined by each of the device apertures for performing a wire bonding operation when a device clamp is in position on a wire bonding machine).

Gas flow paths are provided from each of the inlet ports 504a to a portion of the device apertures 502 defined by device clamp 500. More specifically, gas flow paths are provided from each of the two inlet ports 504a to five of the device apertures 502 defined by device clamp 500. As viewed from FIG. 5A, gas that enters the left hand inlet port 504a travels along length 510a, and then to each of lengths 510b1, 510b2, 510b3, 510b4, and 510b5. From each of these lengths (i.e., lengths 510b1, 510b2, 510b3, 510b4, and 510b5) gas travels to a corresponding one of relatively short lengths 510c1, 510c2, 510c3, 510c4, and 510c5 (these lengths, that is, 520c1, 520c2, 520c3, 520c4, and 520c5, except for length 510c1, are not labeled in FIG. 5A; however, lengths 510c2 and 510c3 are labeled and shown in FIG. 6). Each of the lengths 510c1, 510c2, 510c3, 510c4, and 510c5 terminates at a respective exit opening 506 at a corresponding device aperture 502 (see, for example, FIG. 5B).

Likewise, gas that enters the right hand inlet port 504a travels along length 520a, and then to each of lengths 520b1, 520b2, 520b3, 520b4, and 520b5. From each of these lengths (i.e., lengths 520b1, 520b2, 520b3, 520b4, and 520b5) gas travels to a corresponding one of relatively short lengths 520c1, 520c2, 520c3, 520c4, and 520c5. Each of the lengths 520c1, 520c2, 520c3, 520c4, and 520c5 terminates at a respective exit opening 506 at a corresponding device aperture 502 (see, for example, FIG. 5B).

Thus, a path internal to the body portion of device clamp 500 is defined between each of inlet ports 504a and a corresponding device aperture 502. One exemplary path from the left hand inlet port 504a to the top left hand device aperture 502 (as viewed in FIG. 5A) starts at inlet port 504a, extends along length 510a, turns right to length 510b1 ("right" as shown in FIG. 5A, but of course being a relative term), turns down along length 510c1 ("down" as shown in FIG. 5A, but of course being a relative term), and terminates at exit opening 506 at the top left hand device aperture 502.

Figure 5B:
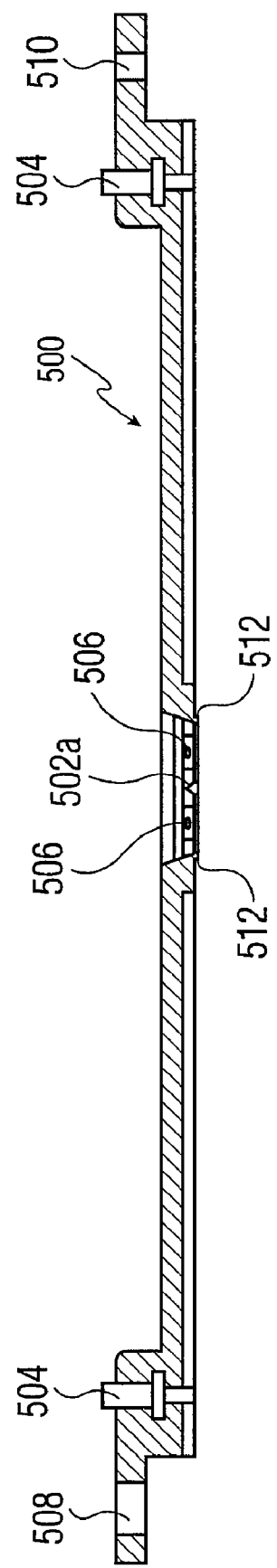
FIG. 5B is a side cross-sectional view of the device clamp of FIG. 5A taken along line 5B-5B of FIG. 5A.

FIG. 5B illustrates a side cross sectional view of device clamp 500. This view illustrates cross member 502a and exit openings 506. Exit openings 506 which lead to a corresponding bond site area are shown extending along what may be termed the y-axis of the wire bonder; however, this designation is a relative expression. FIG. 5B also illustrates connectors 504 (similar to connectors 104 shown in FIG. 1). FIGS. 5A-5B also illustrate apertures 508/510 (e.g., mounting/alignment apertures 508/510), and FIG. 5B illustrates device clamp lip 512.

Figure 6:
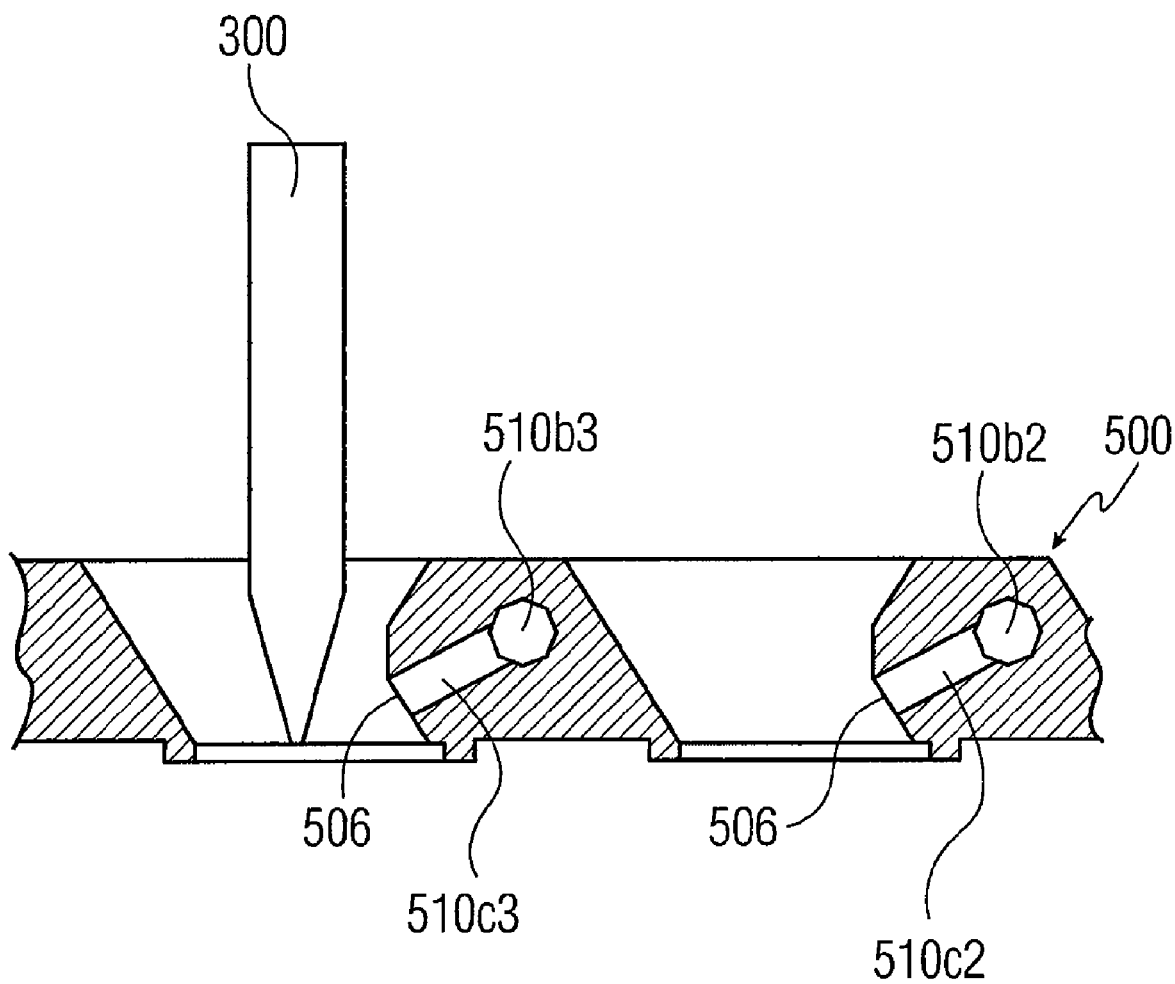
FIG. 6 is a cut-away view of a portion of the device clamp of FIG. 5A taken along line 6-6.

FIG. 6 is a sectional view of a portion of clamp 500 taken along line 6-6 in FIG. 5A. The sectional view of FIG. 6 is rotated 90 degrees with respect to the side sectional view of FIG. 5B. FIG. 6 illustrates exit opening 506, lengths 510$c$2 and 520$c$3, and a portion of lengths 510$b$2 and 510$b$3. Exemplary capillary 300 is also shown.

Figure 7:
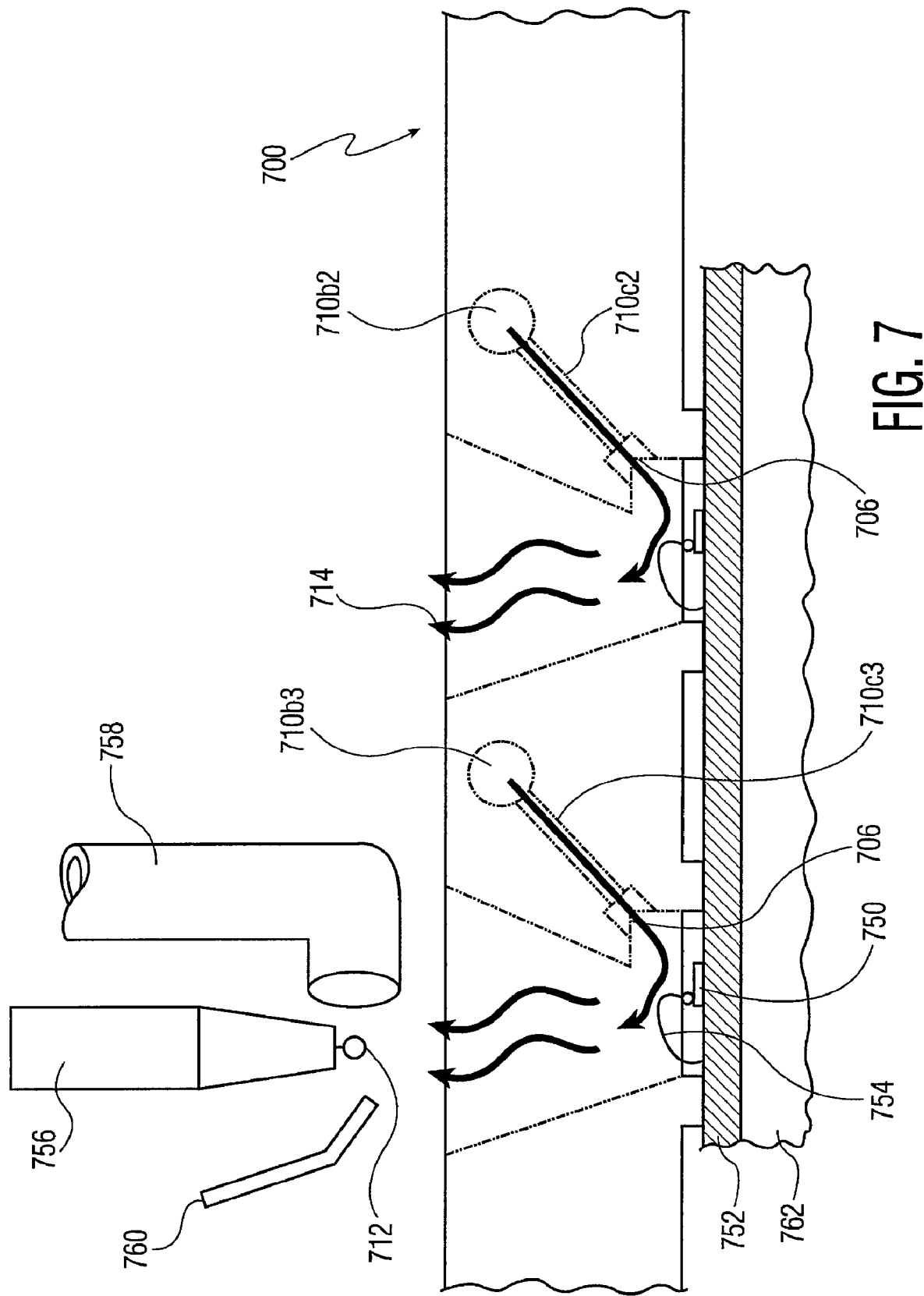
FIG. 7 is a cut-away view of a portion of another clamp similar to that shown in FIG. 5A and other components of a wire bonding machine in accordance with an exemplary embodiment of the present invention.

FIG. 7 is a view of a portion of clamp 700 (a view similar to the view of clamp 500 in FIG. 6), where exemplary clamp 700 defines paths for gas similar to those of clamp 500 illustrated in FIGS. 5A-5B and FIG. 6. FIG. 7 also illustrates substrate 752 (e.g., leadframe 752), semiconductor die 750, and wire loop 754 provided between substrate 752 and semiconductor die 750. Wire loop 754 is formed using capillary 756. As is understood by those skilled in the art, electronic flame off wand 760 is used to form free air ball 712 on an end of a wire extending through capillary 756. Gas tube 758 may be used to provide a gas to reduce the potential of oxidation during formation of free air ball 712. A portion of work table 762 (upon which substrate 752 rests during wire bonding) of a wire bonding machine is also shown. These exemplary wire bonding machine components (capillary, electronic flame off wand, gas tube, work table) are illustrated in FIG. 7 in block form only (not in an installed configuration on the wire bonding machine), and are exemplary in nature and provided for illustrative purposes only. Details of the various wire bonding machine platforms are understood by those skilled in the art.

Clamp 700 illustrated in FIG. 7 defines exit openings 706 (analagous to exit openings 506 in FIG. 6), lengths 710$c$2 and 710$c$3 (analogous to lengths 510$c$2 and 510$c$3 in FIG. 6), and a portion of lengths 710$b$2 and 710$b$3 (analogous to lengths 510$b$2 and 510$b$3 in FIG. 6). As illustrated in FIG. 7, gas 714 flows through opening 706 to a corresponding bond site area to reduce the potential for oxidation in the bond site area.

The gas flowing to the bond site area may be termed a "cover gas" which tends to protect against potential oxidation of the wire (and/or wire ends) during the wire bonding operation. For example, as a free air ball (e.g., free air ball 712 in FIG. 7) is being bonded (e.g., first bonding) to a semiconductor device (e.g., die 750) cover gas (e.g., gas 714) reduces potential oxidation in the bond site area. The reduction in the potential of oxidation in the bond site area applies to various other portions of the wire bonding cycle, for example, during the paying out of wire, during second bonding, during formation of free air balls, during the looping process, etc.

The flow of cover gas (e.g., gas 714) through the clamp to the bond site area may be a continuous flow of cover gas during the entire wire bonding operation. Alternatively, the flow may be a controlled flow (e.g., controlled using a controller integrated with the wire bonding machine) that is provided, for example, during periods of greatest concern regarding potential oxidation.

The drawings provided herein illustrate exemplary flow paths through clamp structures for directing a cover gas to the bond site area; however, the invention is not limited thereto. The present invention contemplates various different flow paths through a clamp structure for providing cover gas to the bond site area.

According to the present invention, special clamps may be manufactured defining the pathways for gas flow. Alternatively, a conventional clamp may be used, and the pathways may be drilled or otherwise defined therein.

When the present invention is used in connection with a wire formed of a reactive metal (e.g., copper, aluminum, etc.) the cover gas is desirably non-reactive with the metal and may be reducing. For example, the cover gas may be an effectively inert gas such as nitrogen or argon. A reducing gas (e.g., hydrogen) may be added to react with any oxygen that may be present (e.g., an exemplary gas is 95% nitrogen and 5% hydrogen); however, the cover gas system of the present invention may be utilized to exclude air from the bond site area without the need for hydrogen in the cover gas. This is a further advantage of the present invention because of the difficulties of using large quantities of highly flammable hydrogen.

Thus, in contrast to conventional systems for reducing oxidation at the bond site area, the present invention provides a simple yet robust design, with very few additional components (and very low additional costs and associated complexities).

The teachings of the present invention may also be utilized in connection with non-reactive bonding wire, such as gold wire. For example, the cover gas may be utilized to provide a shield of clean gas at the bond site area, thereby providing a desirable environment for formation of gold wire loops.

Although the present invention has been described primarily with respect to cover gases such as nitrogen and argon (with or without a forming gas such as hydrogen), it is not limited thereto. Any fluid/gas may be utilized so long as it does not react undesirably with the metal used as a bonding wire.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding system comprising:
a bonding tool for forming wire bonds; and
a device clamp including a body portion defining a plurality of device apertures, each of the device apertures being configured to be positioned adjacent a bond site area of the wire bonding system,
the body portion including an inlet port on an upper surface of the body portion for receiving a fluid from a gas supply source, the body portion defining a fluid path from the inlet port to the plurality of device apertures, the fluid path between the inlet port and each of the device apertures being defined inside the body portion of the device clamp.

2. The wire bonding system of claim 1 wherein the body portion includes a plurality of the inlet ports such that fluid paths are defined between each of the inlet ports and a respective plurality of device apertures.

3. The wire bonding system of claim 1 wherein the body portion includes two of the inlet ports such that fluid paths are defined between each of the inlet ports and a respective plurality of device apertures.

4. The wire bonding system of claim 3 wherein the body portion defines ten of the device apertures, each of the two inlet ports being configured to provide fluid to five of the ten device apertures via the fluid paths defined by the device clamp.

5. The wire bonding system of claim 1 wherein the device clamp includes (1) a lower surface configured to be adjacent a work table of a wire bonding machine, and (2) the upper surface opposite the lower surface.

6. The wire bonding system of claim 5 wherein the device clamp includes a plurality of inlet ports defined in the upper surface of the device clamp.

7. The wire bonding system of claim 6 wherein fluid paths extend from each of the plurality of inlet ports to a respective device apertures.

8. A wire bonding machine comprising:
a work table for supporting devices to be processed by the wire bonding machine; and
a device clamp configured to clamp the devices to be processed, the device clamp defining a plurality of device apertures, each of the device apertures being configured to be positioned adjacent a bond site area of the wire bonding machine, the device clamp including an inlet port on an upper surface of the device clamp for receiving a fluid from a gas supply source, the device clamp defining a fluid path from the inlet port to the plurality of device apertures, the fluid path between the inlet port and each of the device apertures being defined inside the body portion of the device clamp.

9. The wire bonding machine of claim 8 wherein the work table includes a heating element for providing heat to the devices to be processed.

10. The wire bonding machine of claim 8 wherein the device clamp includes a plurality of the inlet ports such that fluid paths are defined between each of the inlet ports and a respective plurality of device apertures.

11. The wire bonding machine of claim 8 wherein the device clamp includes two of the inlet ports such that fluid paths are defined between each of the inlet ports and a respective plurality of device apertures.

12. The wire bonding machine of claim 11 wherein the device clamp defines ten of the device apertures, each of the two inlet ports being configured to provide fluid to five of the ten device apertures via the fluid paths defined by the device clamp.

13. The wire bonding machine of claim 8 wherein the device clamp includes (1) a lower surface configured to be adjacent the work table of the wire bonding machine, and (2) the upper surface opposite the lower surface.

14. The wire bonding machine of claim 13 wherein the device clamp includes a plurality of inlet ports defined in the upper surface of the device clamp.

15. The wire bonding machine of claim 14 wherein fluid paths extend from each of the plurality of inlet ports to a respective plurality of device apertures.

* * * * *